United States Patent
Singer et al.

(10) Patent No.: US 11,038,083 B2
(45) Date of Patent: Jun. 15, 2021

(54) OPTOELECTRONIC SEMICONDUCTOR CHIP

(71) Applicant: OSRAM OLED GmbH, Regensburg (DE)

(72) Inventors: Frank Singer, Regenstauf (DE); Siegfried Herrmann, Neukirchen (DE)

(73) Assignee: OSRAM OLED GmbH, Regensburg (DE)

(*) Notice: Subject to any disclaimer, the term of this patent is extended or adjusted under 35 U.S.C. 154(b) by 189 days.

(21) Appl. No.: 16/323,370

(22) PCT Filed: Aug. 4, 2017

(86) PCT No.: PCT/EP2017/069828
§ 371 (c)(1),
(2) Date: Feb. 5, 2019

(87) PCT Pub. No.: WO2018/029110
PCT Pub. Date: Feb. 15, 2018

(65) Prior Publication Data
US 2020/0365764 A1 Nov. 19, 2020

(30) Foreign Application Priority Data
Aug. 12, 2016 (DE) ................... 10 2016 114 992.6

(51) Int. Cl.
*H01L 33/24* (2010.01)
*H01L 33/08* (2010.01)
(Continued)

(52) U.S. Cl.
CPC ............. *H01L 33/24* (2013.01); *H01L 33/08* (2013.01); *H01L 33/382* (2013.01); *H01L 33/40* (2013.01);
(Continued)

(58) Field of Classification Search
CPC ..... H01L 33/382; H01L 33/486; H01L 33/24; H01L 33/08; H01L 2933/0016;
(Continued)

(56) References Cited

U.S. PATENT DOCUMENTS 9,478,702 B2   10/2016  Hwang et al.
10,134,960 B2* 11/2018  Scholz .................. H01L 33/505
(Continued)

FOREIGN PATENT DOCUMENTS

DE   11 2014 000 592 T5   2/2016
WO      2008/131735 A1   11/2008
WO      2013/083438 A1    6/2013

OTHER PUBLICATIONS

D.M.N.M. Dissanayake et al., "Spontaneous and strong multi-layer graphene n-doping on soda-lime glass and its application in graphene-semiconductor junctions," Scientific Reports, vol. 6, Article No. 21070, Feb. 12, 2016, pp. 1-7.

*Primary Examiner* — Savitri Mulpuri
(74) *Attorney, Agent, or Firm* — DLA Piper LLP (US)

(57) ABSTRACT

An optoelectronic semiconductor chip includes a plurality of core-shell rods that generate electromagnetic radiation spaced apart from each other; a first electrically conductive contact structure for n-side electrical contacting of the core-shell rods; and a second electrically conductive contact structure for p-side electrical contacting of the core-shell rods, wherein the first electrically conductive contact structure and the second electrically conductive contact structure overlap at least in sections in a vertical direction, the optoelectronic semiconductor chip is surface mountable on a mounting side, and at least a partial region of the two electrically conductive contact structures extends through a breakthrough through at least one layer of the optoelectronic semiconductor chip.

10 Claims, 6 Drawing Sheets

(51) Int. Cl.
*H01L 33/38* (2010.01)
*H01L 33/40* (2010.01)
*H01L 33/44* (2010.01)

(52) U.S. Cl.
CPC ...... *H01L 33/44* (2013.01); *H01L 2933/0016* (2013.01); *H01L 2933/0025* (2013.01)

(58) Field of Classification Search
CPC . H01L 33/44; H01L 2933/0033; H01L 33/40; H01L 2933/0025
See application file for complete search history.

(56) References Cited

U.S. PATENT DOCUMENTS

| | | |
|---|---|---|
| 2012/0104432 A1 | 5/2012 | Shim et al. |
| 2013/0313514 A1 | 11/2013 | Hwang et al. |
| 2014/0239327 A1 | 8/2014 | Konsek et al. |
| 2015/0021636 A1* | 1/2015 | Mandi .................. H01L 33/42 257/88 |
| 2015/0207038 A1 | 7/2015 | Hwang et al. |
| 2015/0221823 A1 | 8/2015 | Hwang et al. |
| 2016/0126412 A1 | 5/2016 | Hwang |

\* cited by examiner

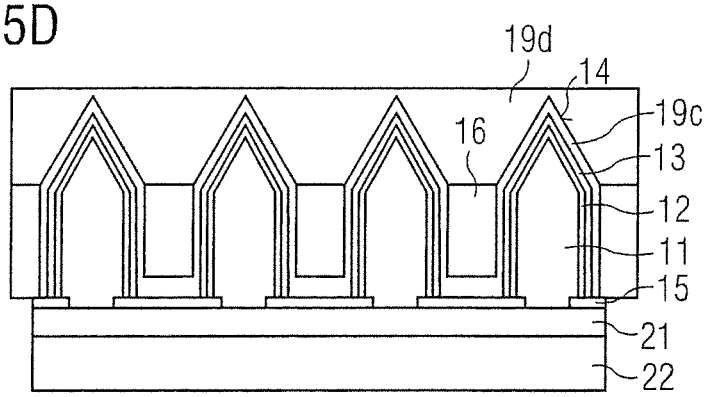
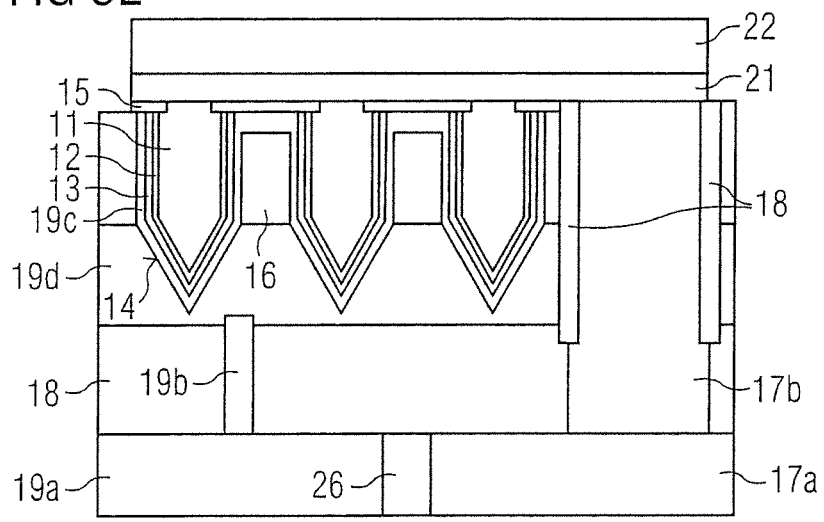
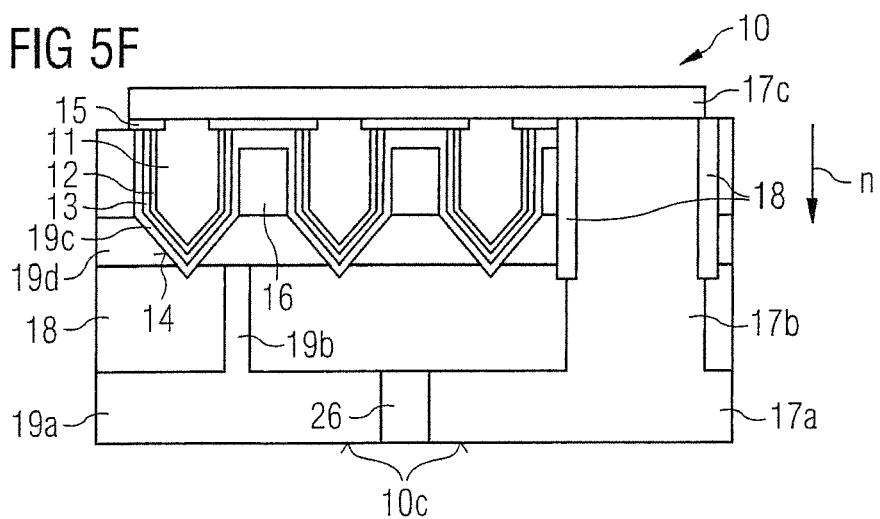

OPTOELECTRONIC SEMICONDUCTOR CHIP

TECHNICAL FIELD

This disclosure relates to an optoelectronic semiconductor chip.

BACKGROUND

WO 2013/083438 A1 describes an optoelectronic semiconductor chip. There is nonetheless a need for an optoelectronic semiconductor chip that can be operated efficiently and is surface mountable.

SUMMARY

We provide an optoelectronic semiconductor chip including a plurality of core-shell rods that generate electromagnetic radiation spaced apart from each other; a first electrically conductive contact structure for n-side electrical contacting of the core-shell rods; and a second electrically conductive contact structure for p-side electrical contacting of the core-shell rods, wherein the first electrically conductive contact structure and the second electrically conductive contact structure overlap at least in sections in a vertical direction, the optoelectronic semiconductor chip is surface mountable on a mounting side, and at least a partial region of the two electrically conductive contact structures extends through a breakthrough through at least one layer of the optoelectronic semiconductor chip.

BRIEF DESCRIPTION OF THE DRAWINGS

FIG. 3F shows an example of a finished semiconductor chip.

FIG. 3F shows an example of a finished semiconductor chip.

FIGS. 5A through 5F shows a process of manufacturing another example of an optoelectronic semiconductor chip on the basis of the schematic sectional views. FIG. 5F shows an example of a finished semiconductor chip.

REFERENCE SIGNS

Figure 1:
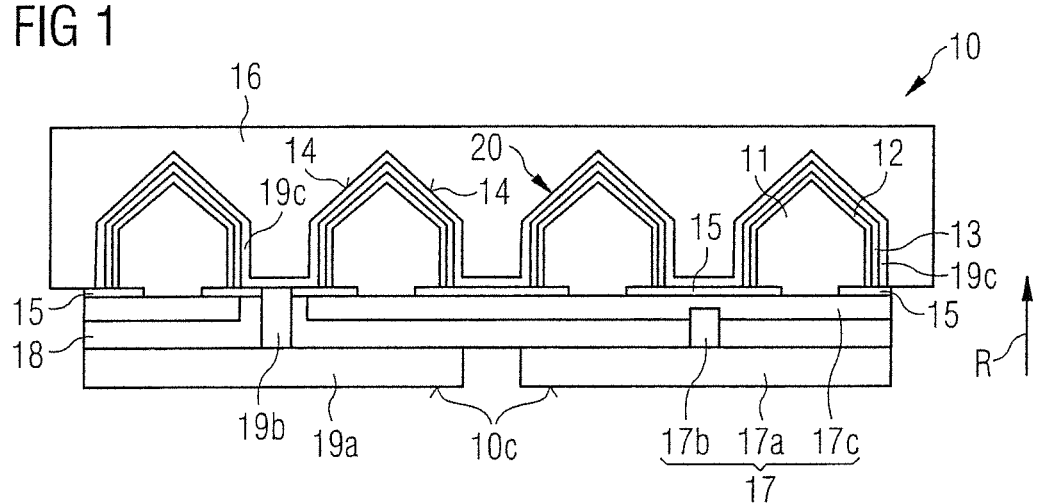
FIG. 1 shows a schematic sectional view of an example of an optoelectronic semiconductor chip.

10 Optoelectronic semiconductor chip
10c mounting side
11 core region
12 active layer
13 cover layer
14 top area
15 mask layer
16 first insulation material
17 first electrically conductive contact structure
17a first connection layer
17b first via
17c first electrically conductive layer
18 insulation layer
19 second electrically conductive contact structure
19a second connection layer
19b second via
19c current expansion layer
19d third electrically conductive layer
20 core-shell rod
21 semiconductor layer
22 growth substrate
23 reflective layer
24 second insulation material
26 plastic reinforcement
R main extension direction
n refractive index

DETAILED DESCRIPTION

Our optoelectronic semiconductor chip is in particular a radiation-emitting semiconductor chip that emits electromagnetic radiation, especially light, during operation.

The optoelectronic semiconductor chip may comprise a plurality of core-shell rods for generating electromagnetic radiation. The core-shell rods are arranged at a distance from each other. This means, for example, that the core-shell rods are arranged in lateral directions, the directions parallel to a main plane of extension of the semiconductor chip such that there is a gap between two adjacent core-shell rods free of the material of the core-shell rods. The core-shell rods, for example, have a length along a main direction of extension greater than the diameter of the core-shell rods. For example, the length is at least three times the diameter. The mean diameter of the core-shell rods can be in the nanometer range or in the micrometer range. The core-shell rods are then in particular so-called "nanorods" or so-called "microrods." Core-shell rods, e.g., can be arranged alongside lateral directions by regular pattern.

The core-shell rods form a large number of active areas of the semiconductor chip that generate electromagnetic radiation during operation of the optoelectronic semiconductor chip. A large part of the electromagnetic radiation generated during operation of the optoelectronic semiconductor chip leaves the optoelectronic semiconductor chip at a radiation exit side through a radiation exit surface, which can also be an imaginary or virtual surface.

The core-shell rods each comprise an n-type semiconductor material and a p-type semiconductor material. For example, an active layer can be arranged between the n-conducting semiconductor material and the p-conducting semiconductor material.

The optoelectronic semiconductor chip may comprise a first electrically conductive contact structure for n-sided electrical contacting of the core-shell rods. The first electrically conductive contact structure may include an electrically conductive first terminal layer to electrically contact the optoelectronic semiconductor chip on a mounting side of the optoelectronic semiconductor chip. The first terminal layer can electrically conductively connect to a first electrically conductive layer. The first electrically conductive layer can contact the core-shell rods on the n-side.

The optoelectronic semiconductor chip may comprise a second electrically conductive contact structure for p-side electrical contacting of the core-shell rods. The second electrically conductive contact structure may include an electrically conductive second terminal layer to electrically contact the optoelectronic semiconductor chip on a mounting side of the optoelectronic semiconductor chip. The second connection layer can electrically conductively connect to a current expansion layer. The current expansion layer can contact the core-shell rods on the p-side.

The first electrically conductive contact structure and the second electrically conductive contact structure may overlap at least in sections in a vertical direction. For example, a vertical direction can be parallel to the main extension direction of the core-shell rods. The vertical direction is especially perpendicular to a main plane of extension of the optoelectronic semiconductor chip, i.e., to the lateral directions. "In sections" means that parts of the first and second electrically conductive contact structures overlap in a vertical direction.

The first electrically conductive contact structure can, for example, comprise a first electrically conductive layer that overlaps at least in places with a second terminal layer of the second electrically conductive contact structure in the vertical direction. Thus, along a direction parallel to the main extension direction of the core-shell rods, parts of the first and second electrically conductive contact structures are arranged one above the other. For example, partial areas of the first electrically conductive layer and the second terminal layer can be arranged one above the other along the vertical direction.

The first and second electrically conductive contact structures may be electrically insulated from each other. For example, an insulation layer can be arranged between the two contact structures so that no direct current flow between the contact structures is possible. A current flow then occurs exclusively via the core-shell rods.

The optoelectronic semiconductor chip can be surface mounted on a mounting side. This means that the first and second electrically conductive contact structures can be electrically contacted on the mounting side. For this purpose, the first and second electrically conductive contact structures can each comprise an electrically conductive terminal layer.

Our optoelectronic semiconductor chip may include:
a plurality of core-shell rods that generate electromagnetic radiation spaced apart from each other,
a first electrically conductive contact structure to n-side electrical contact the core-shell rods, and
a second electrically conductive contact structure to p-side electrical contact the core-shell rods, wherein
the first electrically conductive contact structure and the second electrically conductive contact structure overlap at least in sections in a vertical direction, and
the optoelectronic semiconductor chip is surface mountable on a mounting side.

The core-shell rods represent a three-dimensional arrangement of an active region of the optoelectronic semiconductor chip. The active areas are, for example, designed as "core-shell nano- or microrods," i.e., as core-shell nano- or micro-rods. This increases the active area of the optoelectronic semiconductor chip and thus also the surface through which radiation can escape. This allows a reduced charge carrier density to be achieved with the same operating current and thus an increase in the efficiency of the optoelectronic semiconductor chip. For efficient light extraction from the optoelectronic semiconductor chip, the electrical contacts on the surface of the optoelectronic semiconductor chip can be transparent.

Due to the connection concept with the first and the second electrically conductive contact structure, it is possible that the optoelectronic semiconductor chip can be surface mounted on one mounting side. It is also possible to generate different pixels on the opto-electronic semiconductor chip by structuring, for example, the p-side contacting. In this way, the optoelectronic semiconductor chip can be used as a display device or as part of a display device.

The majority of the core-shell rods may each have a main direction of extension. The core-shell rods, for example, can have the shape of a cylinder, a truncated cone or a prism. The main extension direction of the core-shell rods runs along the height of the core-shell rods.

The core-shell rods may each comprise a core region formed with a first n-type semiconductor material. For example, the core region may extend along the main extension direction and, if the core-shell rods are in the form of a cylinder, the core region may also be in the form of a cylinder.

The core-shell rods may each comprise an active layer that generates electromagnetic radiation and cover the core region at least in directions transverse or perpendicular to the main direction of extension. The core region, for example, has a shell surface that can be completely covered with the material of the active layer. The active layer can be directly adjacent to the core region of the core-shell rods. The electromagnetic radiation generated during operation of the optoelectronic semiconductor chip is generated in the active layer.

The core-shell rods may comprise a cover layer formed with a second p-type semiconductor material and covering the active layer at least in directions transverse to the main extension direction of the core-shell rods. For example, the active layer can be arranged between the core region and the cover layer. The cover layer can completely cover the active layer. The cover layer can also be n-conductive and the core region p-conductive.

The core region of the majority of the core-shell rods may be electrically contacted by the first electrically conductive contact structure and the cover layer of the majority of the core-shell rods may be electrically contacted by the second electrically conductive contact structure.

The second electrically conductive contact structure may have a current expansion layer covering at least a majority of the core-shell rods at least in directions transverse to a main extension direction of the core-shell rods. The current expansion layer may be transparent to electromagnetic radiation generated in the core-shell rods during operation. The current expansion layer may distribute the impressed current as evenly as possible over the optoelectronic semiconductor chip. The current expansion layer can be in direct contact with the cover layer and can cover it completely. For example, the current expansion layer may include a transparent conductive oxide. In other examples, the current expansion layer may include zinc oxide, indium tin oxide and/or graphene.

A first insulating material may be arranged between the plurality of core-shell rods. The first insulation material is transparent to electromagnetic radiation generated in the core-shell rods during operation of the optoelectronic semiconductor chip and surrounds the core-shell rods at least in directions transverse to the main extension direction. The first insulation material borders at least in places directly on the current expansion layer. The spaces between the core-shell rods can be filled with the first insulation material and the first insulation material can completely cover the core-shell rods. The first insulation material may comprise, for example, parylene, fluoropolymer, ormocer, silicon, silicon dioxide or glass.

The insulation material can be applied by hot stamping or hot embossing. The optoelectronic semiconductor chip may be pressed into a polymer material heated to above its glass transition temperature. The core-shell rods may face the polymer material. The first insulation material may allow the electromagnetic radiation generated during operation of the optoelectronic semiconductor chip to leave the optoelectronic semiconductor chip. The upper side of the first insulation material facing away from the core-shell rods can thus represent the radiation exit side.

The optoelectronic semiconductor chip may be free of a growth substrate. A first electrically conductive layer may be epitaxially deposited on the growth substrate. The core-shell rods may be deposited on the first electrically conductive layer. The growth substrate may thus be removed after growth of the core-shell rods. This is a feature that characterizes the optoelectronic semiconductor chip as an object since analysis of the optoelectronic semiconductor chip can prove that the growth substrate has been removed from the epitaxially deposited layers. The growth substrate can, for example, be formed with sapphire.

A second insulating material may be disposed between the plurality of core-shell rods and the first insulating material may be applied to a side of the second insulating material remote from the first contact structure on the second insulating material. The gaps between the core-shell rods can be filled with a low-viscosity material, the second insulation material. The second insulation material may, for example, be a thermoplastic or a radiolucent, for example, clear or transparent thermoset material. The second insulation material can also be applied by vapor deposition and subsequently etched back. The first insulation material may be applied to the second insulation material by hot embossing. The second insulation material in the gaps between the core-shell rods may mechanically reinforce the optoelectronic semiconductor chip during the hot embossing step. This results in higher strength and mechanical stability of the optoelectronic semiconductor chip. After being applied to the semiconductor chip, the two insulation materials are joined to form a uniform body and adhere to each other without the use of bonding agents.

The first insulation material may protrude over the core-shell rods and the first and second electrically conductive contact structures in lateral directions. In lateral directions means in a main plane of extension of the optoelectronic semiconductor chip. For example, the first insulation material can laterally protrude over the core-shell rods and the first and second electrically conductive contact structures when the optoelectronic semiconductor chip is singulated. This enables improved light extraction from the optoelectronic semiconductor chip of the electromagnetic radiation generated during operation of the optoelectronic semiconductor chip.

At least a portion of at least one of the two electrically conductive contact structures may extend through a breakthrough through at least one layer of the optoelectronic semiconductor chip. This means that the breakthrough extends partially along the direction from the mounting side to the radiation exit side of the optoelectronic semiconductor chip. In this example, a breakthrough is an area in which material has been removed or kept free of material. The breakthrough can be produced, for example, by photolithographic processes or dry chemical etching.

The breakthrough, i.e., the area free of the material, may be filled with material of the first or second electrically conductive contact structure. Thus, the material in the through-hole, which can be described as through-hole plating, may connect two layers to each other, which are arranged at different positions in vertical direction. To not contact further layers electrically, a breakthrough in an outer area may have an insulating material. In this example, in an outer area means in the area facing the outer walls of the breakthrough.

For example, a first via of the first electrically conductive contact structure may extend through an insulating layer to a first electrically conductive layer. In another example, the first via of the first electrically conductive contact structure may extend through an insulation layer, a portion of the second electrically conductive contact structure, and the first insulation material to a first electrically conductive layer. In another example, a second via of the second electrically conductive contact structure can extend through the insulation layer and the first electrically conductive layer. In yet another example, the second via of the second electrically conductive contact structure can extend through the insulation layer.

The second electrically conductive contact structure may comprise a large number of vias to enable uniform current impregnation.

The first insulation material may be arranged in the spaces between the core-shell rods such that the core-shell rods are free of the first insulation material on an upper side, e.g., on a cover surface. The upper side of the core-shell rods is located at the top-side along the main direction of extension of the core-shell rods, i.e., on the side of the core-shell rods facing away from the first electrically conductive layer. The core-shell rods may electrically contact at the top-side by a third electrically conductive layer of the second electrically conductive contact structure. The third electrically conductive layer preferably contacts a large number of the core-shell rods via the current expansion layer.

The top-side of the core-shell rods may point in the direction of the mounting side. This means that the optoelectronic semiconductor chip may be reversed after removing the growth substrate such that the top-side of the core-shell rods no longer points in the direction of the radiation exit side of the optoelectronic semiconductor chip but in the direction of the mounting side of the optoelectronic semiconductor chip.

The side of the first electrically conductive layer facing away from the core-shell rods may form a radiation exit side for electromagnetic radiation generated during operation of the optoelectronic semiconductor chip.

Our optoelectronic semiconductor chip may include
the core-shell rods are partially surrounded by a first insulating material such that an upper side of the core-shell rods, on a side of the core-shell rods remote from the first electrically conductive contact structure, is at least partially free of the first insulating material,
an electrically conductive second terminal layer of the second electrically conductive contact structure electrically contacts a plurality of the core-shell rods at the top thereof,
the optoelectronic semiconductor chip is free of a growth substrate,
a portion of the first electrically conductive contact structure extends through a breakthrough through at least one layer of the optoelectronic semiconductor chip,
the first electrically conductive layer is arranged on the side of the core-shell rods facing away from the mounting side of the optoelectronic semiconductor chip, and
the core-shell rods are electrically contacted n-sided via the first electrically conductive layer, the first electrically conductive layer being transparent to electromagnetic radiation generated during operation of the core-shell rods.

The first insulation material may have an increasing optical refractive index in the direction of the third electrically conductive layer. The first insulation material can therefore comprise several layers with different optical refractive indices. The optical refractive index near the radiation exit side of the optoelectronic semiconductor chip may be the smallest compared to the other layers of the first insulation material so that efficient light extraction to the air surrounding the optoelectronic semiconductor chip is enabled.

The first insulation material may have an increasing reflectivity in the direction of the third electrically conductive layer. Thus, electromagnetic radiation generated in the active layer can be decoupled more efficiently from the optoelectronic semiconductor chip.

At least one of the following three layers may be reflective to electromagnetic radiation generated in the core-shell rods: the first insulating material, the third electrically conductive layer, and an insulating layer disposed between the first and second electrically conductive contact structures. One or more of these three layers may contain titanium oxide to increase reflectivity. If one or more of the three layers is reflective to the electromagnetic radiation, it can be decoupled more efficiently from the optoelectronic semiconductor chip. In another example, at least part of the first insulation material can contain a converter material so that the wavelength of the emitted light can be converted.

The first electrically conductive layer may comprise gallium nitride and graphene. In another example, the first electrically conductive layer may comprise gallium nitride and a transparent conductive oxide.

The optoelectronic semiconductor chip may comprise at least in places a plastic reinforcement or a so-called mold supported chip reinforcement on the mounting side. The plastic reinforcement enables better mechanical stability of the optoelectronic semiconductor chip after removal of the growth substrate. The plastic reinforcement can be arranged in particular between the first and second terminal layer and electrically isolate them from each other.

In the following, the optoelectronic semiconductor chips described here and their manufacturing processes are explained in more detail in connection with examples and the corresponding figures.

Same, similar or seemingly similar elements are provided in the figures with the same reference signs. The figures and the proportions of the elements depicted in the figures are not to be regarded as true to scale. Rather, individual elements may be exaggeratedly large for better representability and/or better comprehensibility.

FIG. 1 shows a schematic cross-section of an example of an optoelectronic semiconductor chip 10. The optoelectronic semiconductor chip 10 comprises a large number of core-shell rods 20 arranged at a distance from each other. In this example, the core-shell rods 20 have the shape of a cylinder with an angled top area 14. The top-side of the core-shell rods 20 shows a direction away from a mounting side 10c of the optoelectronic semiconductor chip 10.

The core-shell rods 20 comprise core regions 11 also designed as cylinders with an inclined top area 14. The core regions 11 are formed with an n-type first semiconductor material. Furthermore, the core-shell rods 20 comprise an active layer 12 that in this example completely covers the core regions 11. In the active layer 12 electromagnetic radiation is generated during operation of the optoelectronic semiconductor chip 10.

Further, the core-shell rods 20 comprise a cover layer 13 that completely covers the active layer 12. The cover layer 13 is formed with a p-type second semiconductor material.

The cover layer 13 is completely covered by a current expansion layer 19c. The current expansion layer 19c is radiolucent for electromagnetic radiation generated during operation of the optoelectronic semiconductor chip 10. For example, the current expansion layer 19c can be formed with a transparent conductive oxide.

A first insulation material 16 completely covers the core-shell rods 20 and fills the gaps between the core-shell rods 20. The first insulation material 16 is radiolucent for electromagnetic radiation generated during operation of the optoelectronic semiconductor chip 10. Furthermore, the first insulation material 16 is electrically insulating. For example, the first insulation material 16 may be formed with a parylene, a polymer, a fluoropolymer, ormocer, silicon, silicon dioxide or glass.

A first electrically conductive contact structure 17 contacts the core-shell rods 20 on the n-side, i.e., the first electrically conductive contact structure 17 contacts the core regions 11 of the core-shell rods 20. In this example, the first electrically conductive contact structure 17 has a first electrically conductive layer 17c which electrically contacts a plurality of core regions 11 of the core-shell rods 20. An electrically conductive first via 17b extends through a breakthrough through an insulation layer 18 and contacts the first electrically conductive layer 17c directly. An electrically conductive first terminal layer 17a of the first electrically conductive contact structure 17 electrically conductively connects to the first via 17b and is located on the mounting side 10c of the optoelectronic semiconductor chip 10. The first electrically conductive layer 17c may, for example, be reflective for the electromagnetic radiation generated in the active layer 12.

For example, a mask layer 15 is arranged on the first electrically conductive layer 17c in the spaces between the core-shell rods 20. The mask layer 15 can serve as a photomask with openings during the growth of the core-shell rods 20.

The insulation layer 18 insulates the first electrically conductive contact structure 17 from the second electrically conductive contact structure 19.

The second electrically conductive contact structure 19 comprises the current expansion layer 19c and an electrically conductive second via 19b. The second via 19b extends through a breakthrough from an electrically conductive second terminal layer 19a of the second electrically conductive contact structure 19 to the current expansion layer 19c.

The first electrically conductive contact structure 17 and the second electrically conductive contact structure 19 overlap at least in sections in a vertical direction R. For example, in this example the first electrically conductive layer 17c and the second terminal layer 19a overlap in the vertical direction R. Parts of the first electrically conductive layer 17c and the second terminal layer 19a are thus arranged one above the other in the vertical direction R.

The first and second connection layer 17a, 19a have an outer surface on the mounting side 10c. Thus, the optoelectronic semiconductor chip is surface mountable and can, for example, be mounted on a printed circuit board.

Furthermore, the breakthrough extends through the insulation layer 18 and the first electrically conductive layer 17c. To insulate the second electrically conductive contact structure 19 from the first electrically conductive contact structure 17, the insulating layer 18 also extends through the opening of the second electrically conductive contact structure 19, the second via is thus located in an inner region of the opening of the second electrically conductive contact structure 19 and the insulating layer 18 is located in an outer region of the opening so that the second electrically conductive contact structure 19 is electrically isolated from the first electrically conductive layer 17c. The second connection layer 19a is located on the mounting side 10c of the optoelectronic semiconductor chip 10.

Figure 2A:
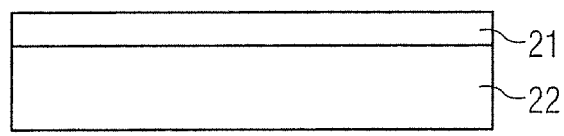
FIGS. 2A through 2C show a process of producing core-shell rods on the basis of the schematic sectional views.
Figure 2B:
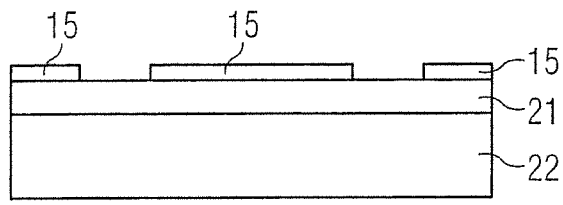
Figure 2C:
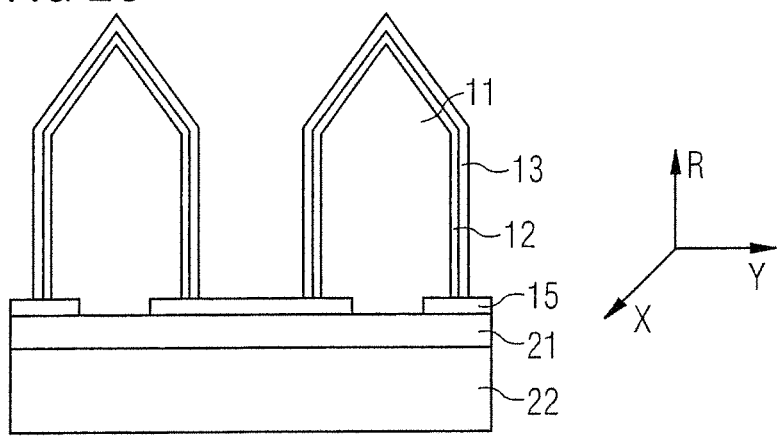

The schematic sections of FIGS. 2A to 2C illustrate a process of manufacturing the core-shell rods 20 of the optoelectronic semiconductor chip 10.

FIG. 2A shows a growth substrate 22 with an epitaxially deposited semiconductor layer 21. The growth substrate 22 can, for example, be formed with sapphire.

FIG. 2B additionally shows a mask layer 15 applied to the semiconductor layer 21 so that the mask layer 15 forms a photomask with openings.

FIG. 2C shows that the core regions 11 are grown in the openings of the mask layer 15. The core regions 11 may, for example, have the shape of cylinders with an angled top area 14.

The active layer 12 is epitaxially deposited on the outer surface of the core regions 11. The cover layer 13 is then epitaxially deposited on the active layer 12. In this example, the cover layer 13 completely covers the active layer 12.

The core regions 11 in this example are formed from an n-type first semiconductor material and the cover layer 13 from a p-type second semiconductor material. However, it is also possible that the core regions 11 are formed from a p-type first semiconductor material and the cover layer 13 from an n-type second semiconductor material.

FIG. 2C shows that the core-shell rods 20 have a principal extension direction R along the growth direction of the core-shell rods 20. The directions x and y extend in a plane which is perpendicular to the main direction of extension R.

Using the schematic sections of FIGS. 3A to 3F, a procedure for manufacturing an example of an optoelectronic semiconductor chip is explained in more detail.

Figure 3A:
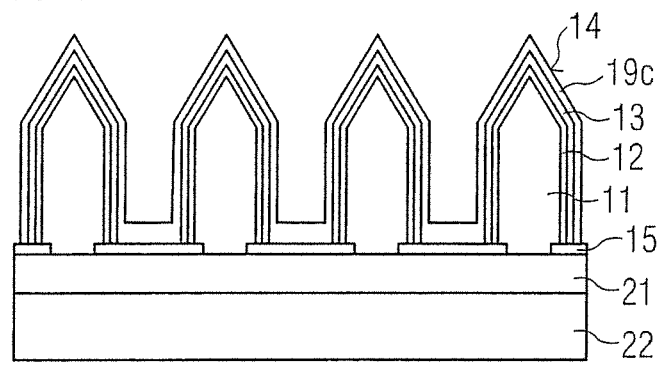
FIGS. 3A through 3F show a process of manufacturing another example of an optoelectronic semiconductor chip on the basis of the schematic sectional views.

FIG. 3A shows an example of four core-shell rods 20 on a growth substrate 22 that are completely covered with a 19c current expansion layer. The four core-shell rods 20 shown represent exemplary a large number of core-shell rods 20.

Figure 3B:
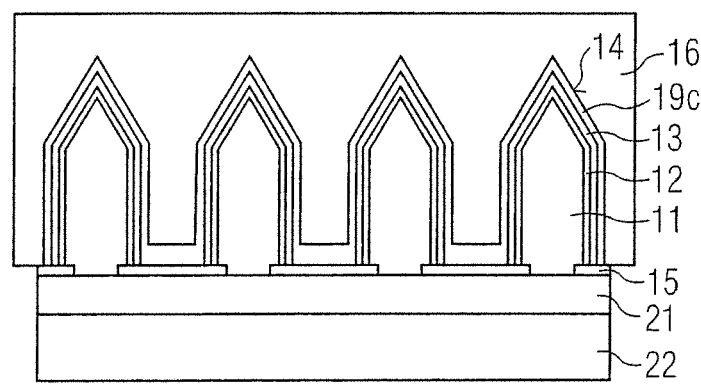

In the next process step, FIG. 3B, the spaces between the core-shell rods 20 are filled with a first insulation material 16. In this example, the first insulation material 16 completely covers the core-shell rods 20. It is also possible, for example, that the first insulation material 16 is applied by hot embossing. The optoelectronic semiconductor chip 10 is pressed into a polymer material heated to above its glass transition temperature.

Figure 3C:
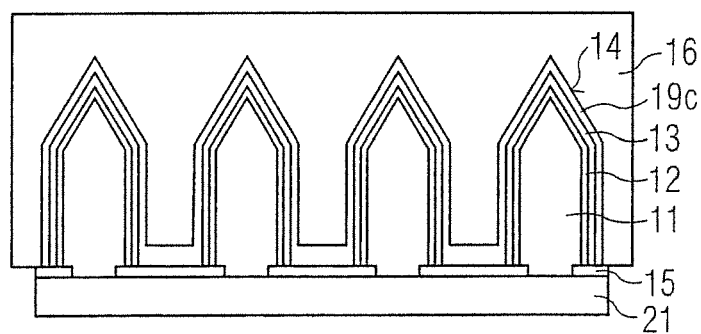

As shown in FIG. 3C, the growth substrate 22 is removed in the next step. The growth substrate 22 can be removed with a laser lift-off process. After the laser lift-off process, the semiconductor layer 21 can be partially etched back to clean it.

Figure 3D:
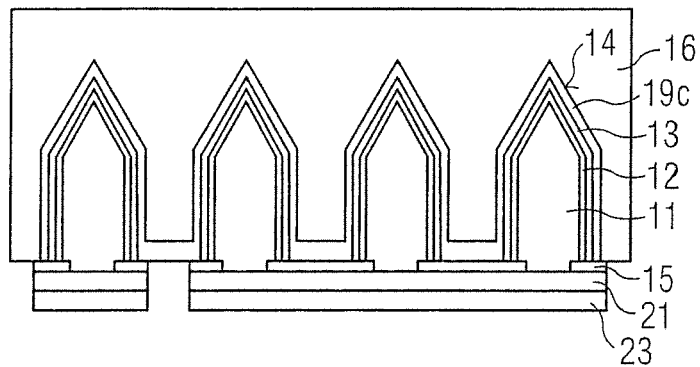

FIG. 3D shows that an electrically conductive reflective layer 23 is applied to the semiconductor layer 21 on its side facing away from the core-shell rods 20. The reflective layer 23 can reflect 10 electromagnetic radiation generated during operation of the optoelectronic semiconductor chip in the direction of the radiation exit side. Furthermore, a breakthrough through the semiconductor layer 21 and the reflective layer 23 is generated.

Figure 3E:
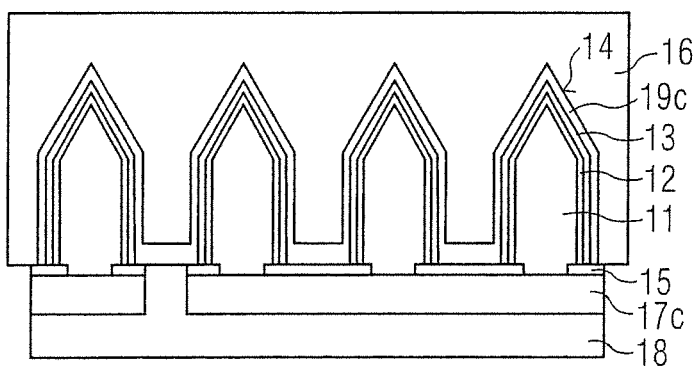

FIG. 3E shows that the semiconductor layer 21 and the reflective layer 23 can be replaced by the first electrically conductive layer 17c in another example. The insulation layer 18 is applied to the first electrically conductive layer 17c on its side facing away from the core-shell rods 20. The insulation layer 18 also fills the breakthrough created.

Figure 3F:
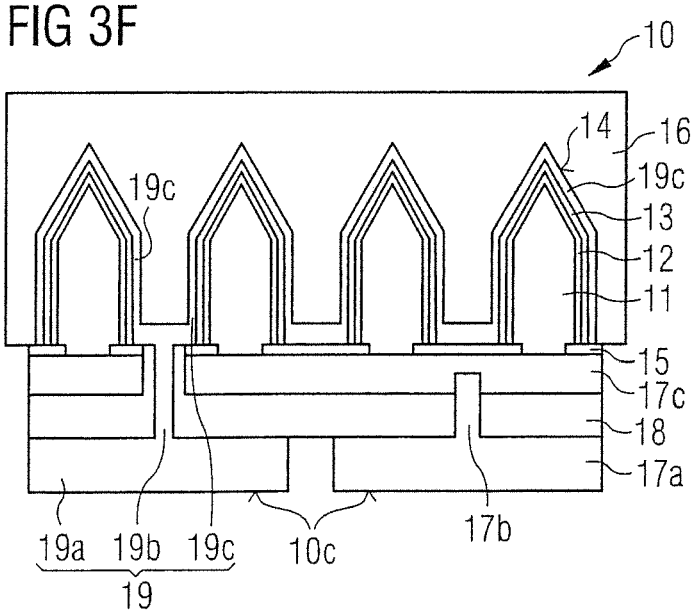

FIG. 3F further describes process steps and a finished semiconductor chip is shown. The second connection layer 19a is placed in places on the mounting side 10c of the optoelectronic semiconductor chip 10 and an electrically conductive area 19b extends through the opening in the direction of the current expansion layer 19c and contacts it electrically. Thus, the second electrically conductive contact structure 19 contacts the core-shell rods 20 p-sided. It is possible that the second electrically conductive contact structure 19 has several openings in the direction of the current expansion layer 19c. Thus, an electric current can be evenly impressed.

The first terminal layer 17a is also located in places on the mounting side 10c of the optoelectronic semiconductor chip 10. A first via 17b of the first electrically conductive contact structure 17 extends through the insulation layer 18 in the direction of the first electrically conductive layer 17c and contacts it electrically. Thus, the first electrically conductive contact structure 17 contacts the core-shell rods 20 n-conducting over the core regions 11.

In another example, it is possible that the first electrically conductive layer 17c has a semiconductor layer 21 and a reflective layer 23.

Figure 4A:
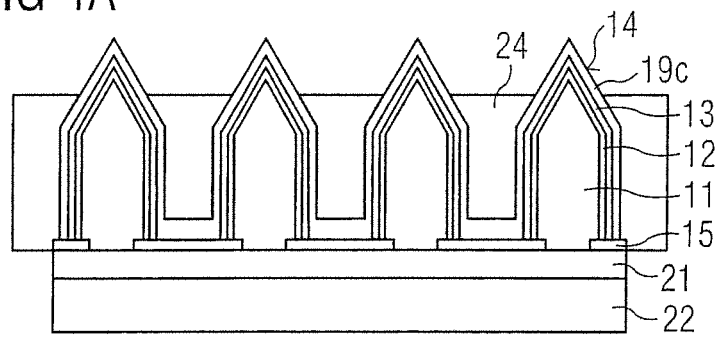
FIGS. 4A through 4C show a process of manufacturing another example of an optoelectronic semiconductor chip on the basis of the schematic sectional views.
Figure 4B:
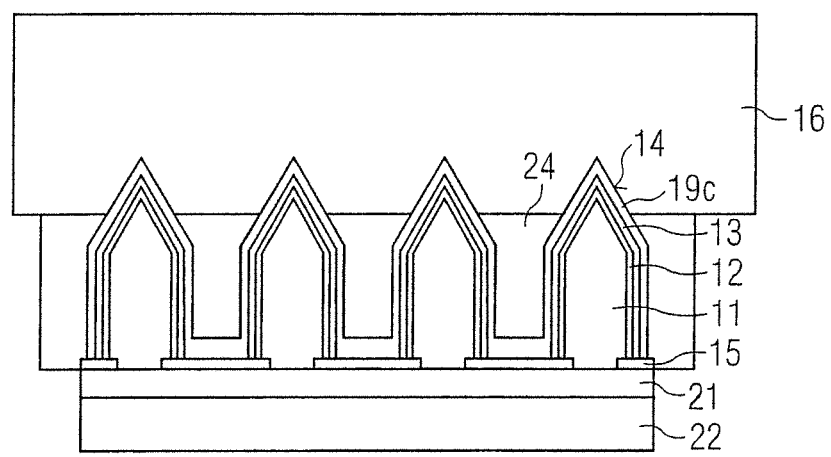

On the basis of the schematic sections of FIGS. 4A to 4B, a process of manufacturing another example of an optoelectronic semiconductor chip is explained in more detail.

FIG. 4A schematically shows four core-shell rods 20 on a growth substrate 22, the interstices between the core-shell rods 20 being filled with a second insulating material 24. In this example, the spaces between the core-shell rods 20 are filled with the second insulation material 24 such that the core-shell rods 20 are in places not covered by the second insulation material 24. The second insulation material 24 can, for example, be formed by a low-viscosity material such as thermoplastic or transparent thermosetting plastic, which is heated for filling. By applying the second insulation material 24, the core-shell rods 20 are additionally mechanically supported so that the optoelectronic semiconductor chip 10 exhibits greater strength, toughness and mechanical stability.

In the next process step, FIG. 4B, the optoelectronic semiconductor chip 10 is pressed into a polymer material by hot embossing, for example. In this process step, the first insulation material 16 is applied to the optoelectronic semiconductor chip 10. It is advantageous if the optoelectronic semiconductor chip 10 is additionally supported by the second insulation material 24. After being applied to the optoelectronic semiconductor chip 10, the two insulation materials 16, 24 connect to form a uniform body. The first insulation material 16 protrudes over the core-shell rods 20 and the first and second electrically conductive contact structures 17, 19 in lateral directions in a main extension plane of the optoelectronic semiconductor chip 10. For example, the first insulation material 16 can protrude over the core-shell rods 20 and the first and second electrically conductive contact structures 17, 19 laterally when the optoelectronic semiconductor chip 10 is singulated. This enables improved light extraction of the electromagnetic radiation generated during operation of the optoelectronic semiconductor chip 10 from the optoelectronic semiconductor chip 10.

Figure 4C:
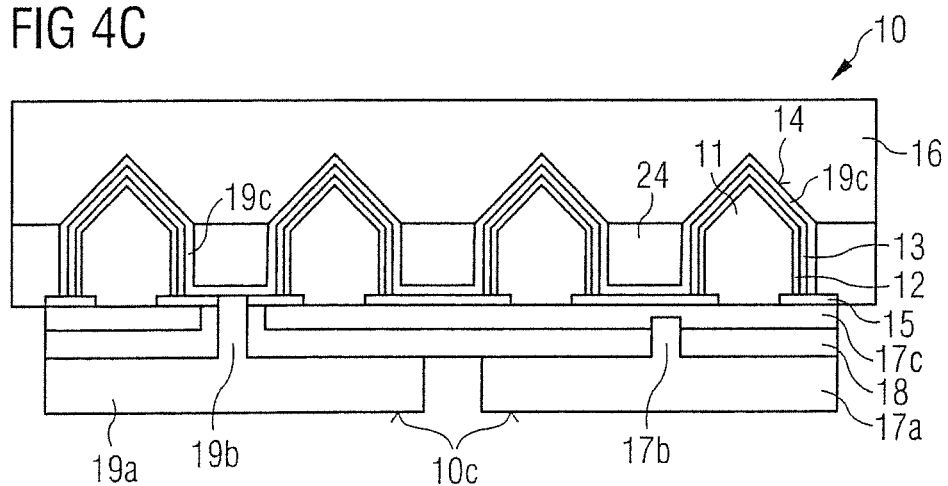

FIG. 4C shows an example of an optoelectronic semiconductor chip 10 manufactured with the process steps shown in FIGS. 3C to 3F. In addition, this example shows the first and second insulation materials 16, 24 applied as described in connection with FIGS. 4A and 4B.

On the basis of the schematic sectional drawings of FIGS. 5A to 5F, a process of producing another example of an optoelectronic semiconductor chip is explained in more detail.

Figure 5A:
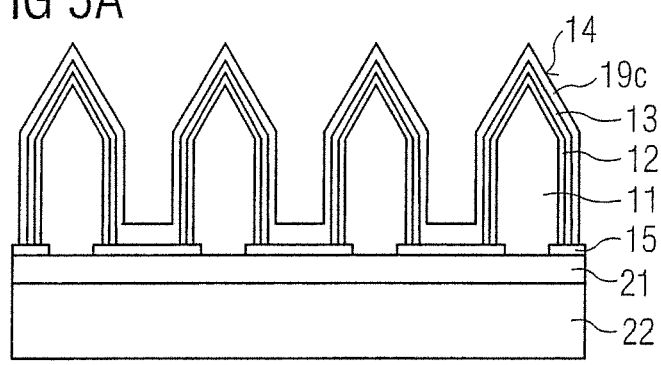

FIG. 5A shows an example of four core-shell rods on a growth substrate 22.

Figure 5B:
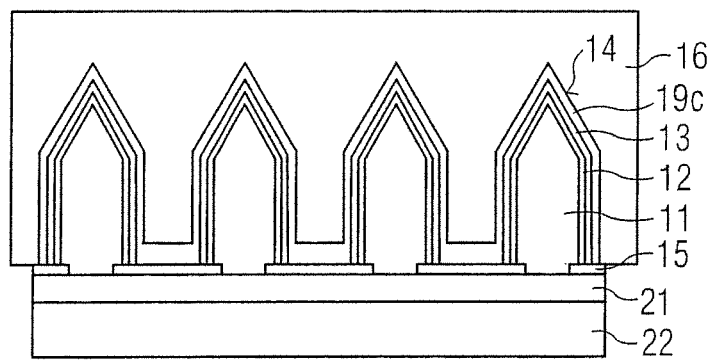

FIG. 5B shows that the spaces between the core-shell rods 20 are filled with the first insulation material 16.

Figure 5C:
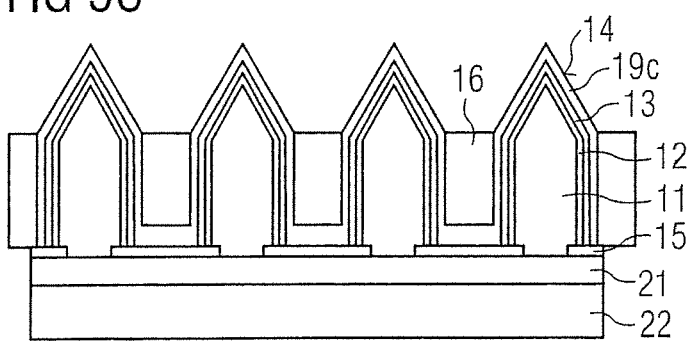

In the next process step, FIG. 5C, the first insulation material 16 is etched back so that it no longer completely covers the core-shell rods 20 on their upper side. This means that the top areas 14 of the core-shell rods 20 are partially free of the first insulation material 16. The etching process can be carried out with a plasma, for example.

As shown in FIG. 5D, a third electrically conductive layer 19d is then applied to the core-shell rods 20 and the first insulation layer 16 so that the third electrically conductive layer 19d electrically contacts the core-shell rods 20 through the current expansion layer 19c. The third electrically conductive layer 19d is directly adjacent to the first insulation material 16. The third electrically conductive layer 19d may be reflective to electromagnetic radiation generated in the core-shell rods 20 during operation of the optoelectronic semiconductor chip 10.

In the next process step, FIG. 5E, the growth substrate 22 is flipped with the core-shell rods 20, the third electrically conductive layer 19d and the first insulating material 16 such that the upper side of the core-shell rods 20 points in the direction of the mounting side 10c of the optoelectronic semiconductor chip 10. This means that the growth substrate 22 is on the radiation exit side of the optoelectronic semiconductor chip 10 after this rotation. Similar to the example shown in FIG. 3F, the first electrically conductive contact structure 17 comprises a first terminal layer 17a electrically conductively connected to an electrically conductive first via 17b extending through a breakthrough through multiple layers of the optoelectronic semiconductor chip 10. The first via 17b also electrically conductively connects to the first semiconductor layer 21.

The second electrically conductive contact structure 19 comprises the third electrically conductive layer 19d that electrically conductively connects to an electrically conductive second via 19b extending through a breakthrough through the insulation layer 18. The second via 19b electrically conductively connects to the second terminal layer 19a. The insulation layer 18 insulates the first and the second electrically conductive contact structure 17, 19 against each other. The third electrically conductive layer 19d and the first terminal layer 17a are located on the mounting side 10c of the optoelectronic semiconductor chip 10. On the mounting side 10c, the third electrically conductive layer 19d and the first terminal layer 17a are insulated from each other by a plastic reinforcement 26.

In the next step, FIG. 5F, the growth substrate 22 is removed by laser lift-off. In addition, the semiconductor layer 21 is removed. After removing the semiconductor layer 21, a first electrically conductive layer 17c is applied to the radiation exit side of the optoelectronic semiconductor chip 10. The first electrically conductive layer 17c electrically conductively connects to the first via 17b.

FIG. 5F shows a finished example of an optoelectronic semiconductor chip 10. The top-side of the core-shell rods 20 is at least partially free of the first insulation material 16 and points in the direction of the mounting side 10c of the optoelectronic semiconductor chip 10. This means that the optoelectronic semiconductor chip 10 is turned over after removing the growth substrate 22 such that the top-side of the core-shell rods 20 no longer points in the direction of the radiation exit side of the optoelectronic semiconductor chip 10, but in the direction of the mounting side 10c of the optoelectronic semiconductor chip 10.

The third electrically conductive layer 19d contacts the core-shell rods 20 on their upper side electrically via the current expansion layer 19c. The third electrically conductive layer 19d electrically conductively connects to the second terminal layer 19a via the second vias 19b.

The first electrically conductive layer 17c is arranged on the side of the core-shell rods 20 facing away from the mounting side 10c. The core-shell rods 20 are electrically contacted on the n side via the first electrically conductive layer 17c, whereby the first electrically conductive layer 17c is transparent to electromagnetic radiation generated in the core-shell rods 20 during operation of the optoelectronic semiconductor chip 10. The first electrically conductive layer 17c electrically conductively connects to the first terminal layer 17a via the first via 17b.

The first electrically conductive layer 17c can, for example, be formed with a transparent conductive oxide such as zinc oxide, or with gallium nitride and graphene.

The first insulation material 16 may have a gradient in the optical refractive index n. This means that the first insulation material 16 can consist of different layers, the refractive index n being highest on the side facing the third electrically conductive layer 19d and decreasing in the direction of the first electrically conductive layer 17c. This enables emitted electromagnetic radiation to be efficiently decoupled during operation of the optoelectronic semiconductor chip.

The insulation layer 18, the second connection layer 19a and the first insulation material 16 can be reflective and formed, for example, with titanium oxide.

On the mounting side 10c, the third electrically conductive layer 19d and the first connection layer 17a are insulated from each other by a plastic reinforcement 26. The plastic reinforcement 26 enables greater mechanical stability of the optoelectronic semiconductor chip 10 after removal of the growth substrate 22.

Our chips and methods are not limited by the description using the examples. Rather, this disclosure includes any new feature and combination of features that in particular includes any combination of features in the appended claims, even if the feature or combination itself is not explicitly mentioned in the claims or examples.

This application claims priority of DE 10 2016 114 992.6, the subject matter of which is incorporated herein by reference.

The invention claimed is:

1. An optoelectronic semiconductor chip comprising:
    a plurality of core-shell rods that generate electromagnetic radiation spaced apart from each other;
    a first electrically conductive contact structure for n-side electrical contacting of said core-shell rods; and
    a second electrically conductive contact structure for p-side electrical contacting of the core-shell rods, wherein
    the first electrically conductive contact structure and the second electrically conductive contact structure overlap at least in sections in a vertical direction,
    the optoelectronic semiconductor chip is surface mountable on a mounting side, and
    at least a partial region of each of the two electrically conductive contact structures extends through a breakthrough through at least one layer of the optoelectronic semiconductor chip.

2. The optoelectronic semiconductor chip according to claim 1, wherein at least a majority of the core-shell rods each comprise
    a main extension direction, a core region formed with a first n-type semiconductor material, an active layer that generates electromagnetic radiation that covers the core region at least in directions transverse to the main extension direction, a cover layer formed with a second p-type semiconductor material and covering the active layer at least in directions transverse to the main extension direction, wherein the core region of the majority of the core-shell rods is electrically contacted by the first electrically conductive contact structure, and the cover layer of the majority of the core-shell rods is electrically contacted by the second electrically conductive contact structure.

3. The optoelectronic semiconductor chip according to claim 1, wherein the second electrically conductive contact structure has a current expansion layer covering at least a majority of the core-shell rods at least in directions transverse to a main extension direction of the core-shell rods, the current expansion layer being transparent to electromagnetic radiation generated in use in the core-shell rods, and a first insulation material is disposed between the plurality of core-shell rods, the first insulation material being transparent to electromagnetic radiation generated in use in the core-shell rods, the first insulation material surrounding the core-shell rods at least in directions transverse to the main extension direction, and the first insulation material adjoining the current expansion layer at least in places.

4. The optoelectronic semiconductor chip according to claim 3, wherein the optoelectronic semiconductor chip is free of a growth substrate.

5. The optoelectronic semiconductor chip according to claim 1, wherein a second insulating material is disposed between said plurality of core-shell rods, and the first insulation material is applied to a side of the second insulation material facing away from the first contact structure on the second insulation material.

6. The optoelectronic semiconductor chip according to claim 1, wherein a first insulating material is disposed between said plurality of core-shell rods, and said first insulating material projects beyond the core-shell rods and the first and second electrically conductive contact structures in lateral directions.

7. The optoelectronic semiconductor chip according to claim 1, wherein the core-shell rods are partially surrounded by a first insulating material such that an upper side of the core-shell rods, on a side of the core-shell rods facing away from the first electrically conductive contact structure, is at least partially free of the first insulating material, an electrically conductive second terminal layer of the second electrically conductive contact structure electrically contacts a plurality of the core-shell rods at their top-side, the optoelectronic semiconductor chip is free of a growth substrate, a portion of said first electrically conductive contact structure extends through a breakthrough through at least one layer of said optoelectronic semiconductor chip, a first electrically conductive layer is arranged on the side of the core-shell rods facing away from the mounting side of the optoelectronic semiconductor chip, and the core-shell rods are electrically contacted on the n-sides via the first electrically conductive layer, the first electrically conductive layer being transparent to electromagnetic radiation generated during operation of the core-shell rods.

8. The optoelectronic semiconductor chip according to claim 7, wherein the first insulating material has an increasing optical refractive index in the direction of the second terminal layer.

9. The optoelectronic semiconductor chip according to claim 7, wherein at least one of the following three layers is reflective to electromagnetic radiation generated in the core-shell rods: the first insulating material, the second terminal layer, and an insulating layer disposed between the first and second electrically conductive contact structures.

10. The optoelectronic semiconductor chip according to claim 7, wherein said first electrically conductive layer comprises gallium nitride and graphene.

* * * * *